(12) United States Patent
Egashira

(10) Patent No.: US 9,272,310 B2
(45) Date of Patent: Mar. 1, 2016

(54) LIQUID PROCESSING APPARATUS

(71) Applicant: Tokyo Electron Limited, Tokyo (JP)

(72) Inventor: Koji Egashira, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 470 days.

(21) Appl. No.: 13/784,932

(22) Filed: Mar. 5, 2013

(65) Prior Publication Data

US 2013/0233361 A1    Sep. 12, 2013

(30) Foreign Application Priority Data

Mar. 9, 2012    (JP) .................................. 2012-053459

(51) Int. Cl.
*B08B 3/02* (2006.01)
*H01L 21/67* (2006.01)
*H01L 21/687* (2006.01)

(52) U.S. Cl.
CPC .......... *B08B 3/024* (2013.01); *H01L 21/67051* (2013.01); *H01L 21/68728* (2013.01); *H01L 21/68742* (2013.01); *H01L 21/68792* (2013.01)

(58) Field of Classification Search
None
See application file for complete search history.

(56) References Cited

U.S. PATENT DOCUMENTS 7,387,131 B2 *    6/2008    Kuroda et al. ................ 134/149

FOREIGN PATENT DOCUMENTS

| JP | 63-153839 A | 6/1988 |
|---|---|---|
| JP | 04-186626 A | 7/1992 |
| JP | 10-209254 A | 8/1998 |
| JP | 10-303110 A | 11/1998 |
| JP | 10303110 A * | 11/1998 |
| JP | 2004-186633 A | 7/2004 |

* cited by examiner

*Primary Examiner* — Michael Barr
*Assistant Examiner* — Cristi Tate-Sims
(74) *Attorney, Agent, or Firm* — Abelman, Frayne & Schwab

(57) ABSTRACT

A liquid processing apparatus includes a substrate holding unit and an elevating member provided to ascend/descend with respect to the substrate holding unit. The substrate holding unit includes a holding base, and a first engagement member and a second engagement member which are provided to be movable in the holding base, and moved between an engaging position where the member is engaged with the peripheral edge of the substrate and a releasing position where the member releases the substrate. When the first contact unit connected to the first engagement member is in contact with a first portion to be contacted, the first engagement member is located at the engaging position. When the second contact unit connected to the second engagement member is in contact with a second portion to be contacted at a lower position than the first portion, the second engagement member is located at the engaging position.

19 Claims, 9 Drawing Sheets

FIG.8.A

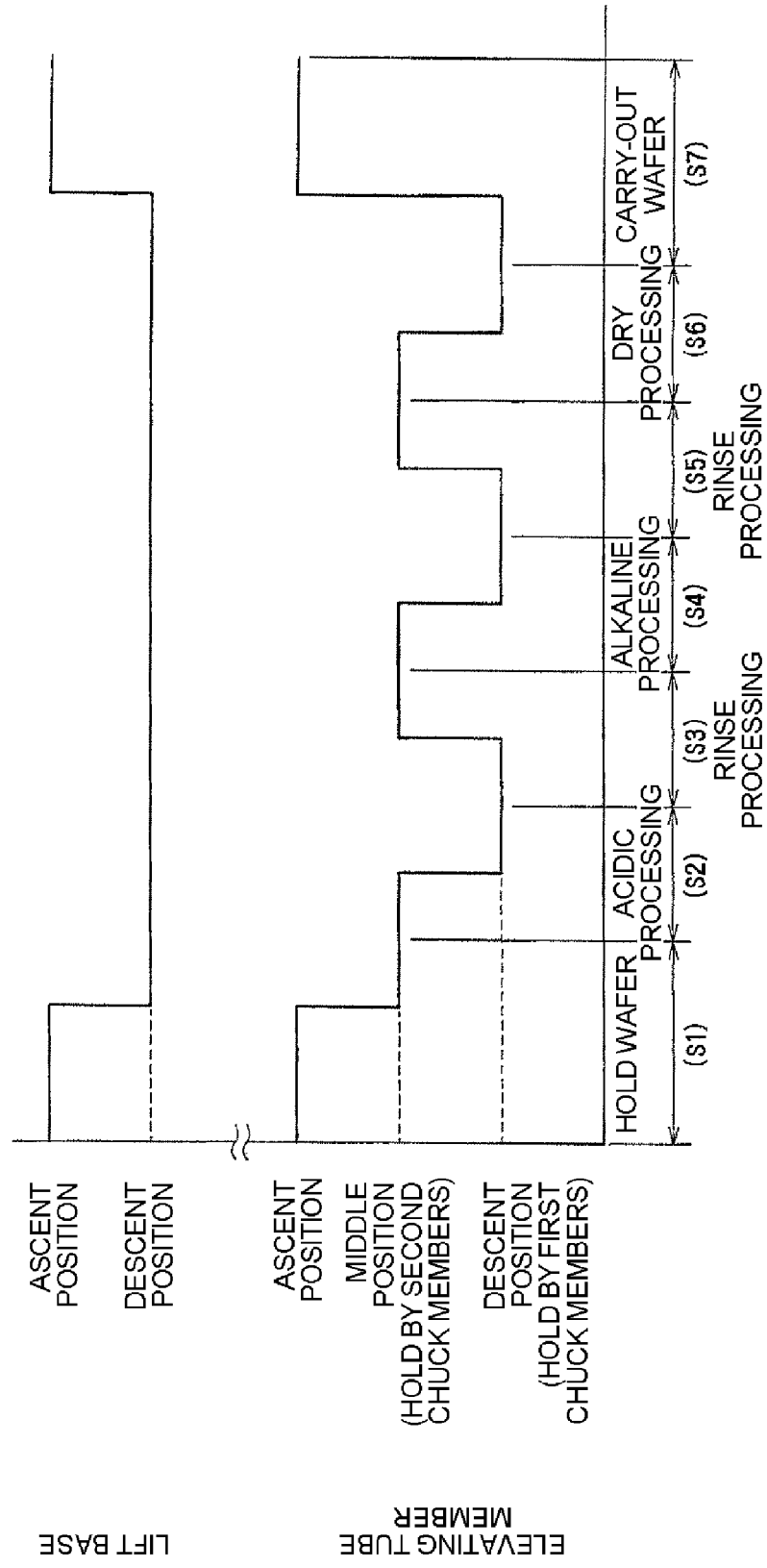

LIQUID PROCESSING APPARATUS

CROSS-REFERENCE TO RELATED APPLICATIONS

This application is based on and claims priority from Japanese Patent Application No. 2012-053459, filed on Mar. 9, 2012, with the Japanese Patent Office, the disclosure of which is incorporated herein in its entirety by reference.

TECHNICAL FIELD

The present disclosure relates to a liquid processing apparatus that performs a liquid processing for a substrate while holding the substrate horizontally.

BACKGROUND

In manufacturing processes of semiconductor products or flat panel displays (FPDs), a process is frequently used in which a processing liquid is supplied to a semiconductor wafer or a glass substrate ("a substrate to be processed") for performing a liquid processing. For example, such a process involves a cleaning processing that removes, for example, particles and contaminations attached to the substrate.

As for a liquid processing apparatus that performs a cleaning processing, a single wafer spin cleaning apparatus is known that supplies a processing liquid (for example, a chemical liquid and a rinse liquid) to a surface of a substrate such as, for example, a semiconductor wafer in a state where the substrate is held on a spin chuck and rotated horizontally, thereby performing a cleaning processing (See, e.g., Japanese Patent Application Laid-Open No. 10-209254).

SUMMARY

The present disclosure provides a liquid processing apparatus including: a substrate holding unit configured to hold a substrate horizontally; a nozzle configured to supply a processing liquid to the substrate held by the substrate holding unit; an elevating member configured to ascend/descend with respect to the substrate holding unit; and an elevation driving unit configured to raise/lower the elevating member. The substrate holding unit includes a holding base, and first and second engagement members which are provided to be movable in the holding base, and each of the first and second engagement members is moved by a biasing force of a biasing force giving mechanism between an engaging position where each of the first and second engagement members is engaged with the peripheral edge of the substrate and a releasing position where the member releases the substrate. The first engagement member is connected with a first contact unit contacted with the outer peripheral surface of the elevating member, and the second engagement member is connected to a second contact unit contacted with the outer peripheral surface of the elevating member. The elevating member includes a first portion to be contacted and a second portion to be contacted at a lower position than the first portion which are provided on the outer peripheral surface of the elevating member and disposed at different positions in the ascending/descending direction of the elevating member. When the first contact unit is in contact with the first portion to be contacted, the first engagement member is located at the engaging position, and when the second contact unit is in contact with the second portion to be contacted, the second engagement member is located at the engaging position.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIG. 8A is a cross-sectional view taken along line A-A in FIG. 7.

FIG. 10 is a view illustrating the positions of the elevating tube member and the positions of the lift base at each process of a liquid processing method according to the present exemplary embodiment.

DETAILED DESCRIPTION

Figure 1:
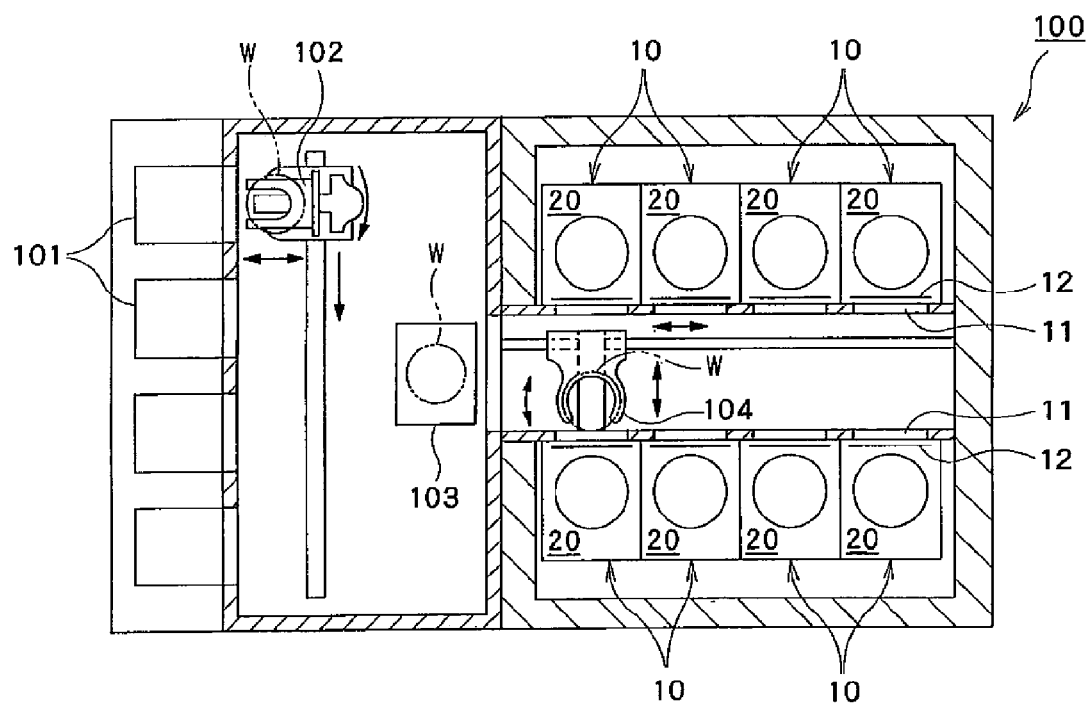
FIG. 1 is a plan view illustrating a liquid processing system including a liquid processing apparatus according to an exemplary embodiment.

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

When a wafer is cleaned, the peripheral edge of the wafer is held by a holding unit of a spin chuck. For that reason, it is difficult to supply processing liquid to an area of a wafer which is held by the holding unit. Therefore, it is difficult to perform a cleaning process for the area and the surroundings.

The present disclosure has been made in an effort to provide a liquid processing apparatus capable of suppressing an unprocessed area, where a liquid processing is not performed, from being formed in a substrate.

The present disclosure provides a liquid processing apparatus including: a substrate holding unit configured to hold a substrate horizontally; a nozzle configured to supply a processing liquid to the substrate held by the substrate holding unit; an elevating member configured to ascend/descend with respect to the substrate holding unit; and an elevation driving unit configured to raise/lower the elevating member. The substrate holding unit includes a holding base and a first engagement member and a second engagement member which are provided to be movable in the holding base, and each of the first and second engagement members is moved by a biasing force of a biasing force giving mechanism between an engaging position where each of the first and second engagement members is engaged with the peripheral edge of the substrate and a releasing position where each of the first and second engagement members releases the substrate. The first engagement member is connected with a first contact unit contacted with the outer peripheral surface of the elevating member, the second engagement member is connected to a second contact unit contacted with the outer peripheral surface of the elevating member, the elevating member includes a first portion to be contacted and a second portion to be contacted at a lower position than the first portion which are provided in the outer peripheral surface of the elevating member and disposed at different positions in the ascending/descending direction of the elevating member. When the first contact unit is in contact with the first portion to be contacted, the first engagement member is located at the engaging position, and when the second contact unit is in contact with the second portion to be contacted, the second engagement member is located at the engaging position.

In the above-described liquid processing apparatus, when the first contact unit and the second contact unit are in contact with the outer peripheral surface of the elevating member other than the first portion to be contacted and the second portion to be contacted, the first engagement member and the second engagement member may be located at the releasing position.

In the above-described liquid processing apparatus, the first portion to be contacted and the second portion to be contacted may be formed in a concave shape with respect to the outer peripheral surface of the elevating member.

In the above-described liquid processing apparatus, a lower portion of the first portion to be contacted may be located at the same position or below an upper portion of the second portion to be contacted in the ascending/descending direction of the elevating member.

In the above-described liquid processing apparatus, each of the first contact unit and the second contact unit may include a roller capable of being rotated in the ascending/descending direction in the outer peripheral surface of the elevating member.

In the above-described liquid processing apparatus, the nozzle may be configured to supply a processing liquid to the top surface of the substrate held by the substrate holding unit, the elevating member may be formed in a cylindrical shape, and in the inner side of the elevating member, a bottom side processing liquid supply pipe that supplies a processing liquid to the bottom surface of the substrate held by the substrate holding unit is provided.

The above-described liquid processing apparatus may further include a rotation driving unit that includes a rotating shaft which rotates the substrate holding unit. The elevating member may be connected to the rotating shaft and rotated together with the substrate holding unit.

In the above-described liquid processing apparatus, the substrate holding unit may include three first engagement members and three second engagement members which are disposed alternately in the circumference direction of the substrate, and the elevating member includes three first portions to be contacted and three second portions to be contacted which correspond the first engagement members and the second engagement members, respectively.

In the above-described liquid processing apparatus, when the first contact unit is in contact with the first portion to be contacted, the second contact unit may be in contact with an outer peripheral surface of the elevating member other than the first portion to be contacted and the second portion to be contacted.

In the above-described liquid processing apparatus, while the processing liquid is being supplied from the nozzle, the first contact unit may be moved from the first portion to be contacted to a position where the first contact unit is in contact with an outer peripheral surface of the elevating member other than first portion to be contacted and the second portion to be contacted, and the second contact unit may be moved from a position where the second contact unit is in contact with an outer peripheral surface of the elevating member other than the first portion to be contacted and the second portion to be contacted to the second portion to be contacted.

In the above-described liquid processing apparatus, a time period where the first contact unit is in contact with the first portion to be contacted and a time period where the second contact unit is in contact with the second portion to be contacted may be overlapped.

According to the liquid processing apparatus of the present disclosure, unprocessed area where a liquid processing is not performed is suppressed from being formed in the substrate.

Hereinafter, the exemplary embodiments of the present disclosure will be described. In addition, in the figures accompanying the present specification, for the convenient and easy illustration and understanding, for example, the scale and the aspect ratio in size are properly changed and exaggerated from the real sizes.

First, referring to FIG. 1, a liquid processing system according to an exemplary embodiment of the present disclosure will be described.

As illustrated in FIG. 1, a liquid processing system 100 includes: a disposing table 101 on which a carrier accommodating a substrate to be processed such as, for example, a semiconductor wafer W ("wafer W") is disposed from the outside; a transport arm 102 configured to take out wafer W accommodated in the carrier; a rack unit 103 in which the wafer W taken-out by transport arm 102 is disposed; and a transport arm 104 configured to receive wafer W disposed in rack unit 103 and transport received wafer W into a liquid processing apparatus 10. As illustrated in FIG. 1, liquid processing system 100 is also provided with a plurality of (eight in the aspect illustrated in FIG. 1) liquid processing apparatuses 10.

Further, in the side wall of each of liquid processing apparatuses 10, an opening 11 is provided to carry wafer W into a liquid processing chamber 20 or carry wafer W out from liquid processing chamber 20 by transport arm 104. Opening 11 is provided with a shutter 12 configured to open/close opening 11.

Next, a schematic configuration of liquid processing apparatus 10 according to the present exemplary embodiment will be described with reference to FIGS. 2 and 3.

Figure 2:
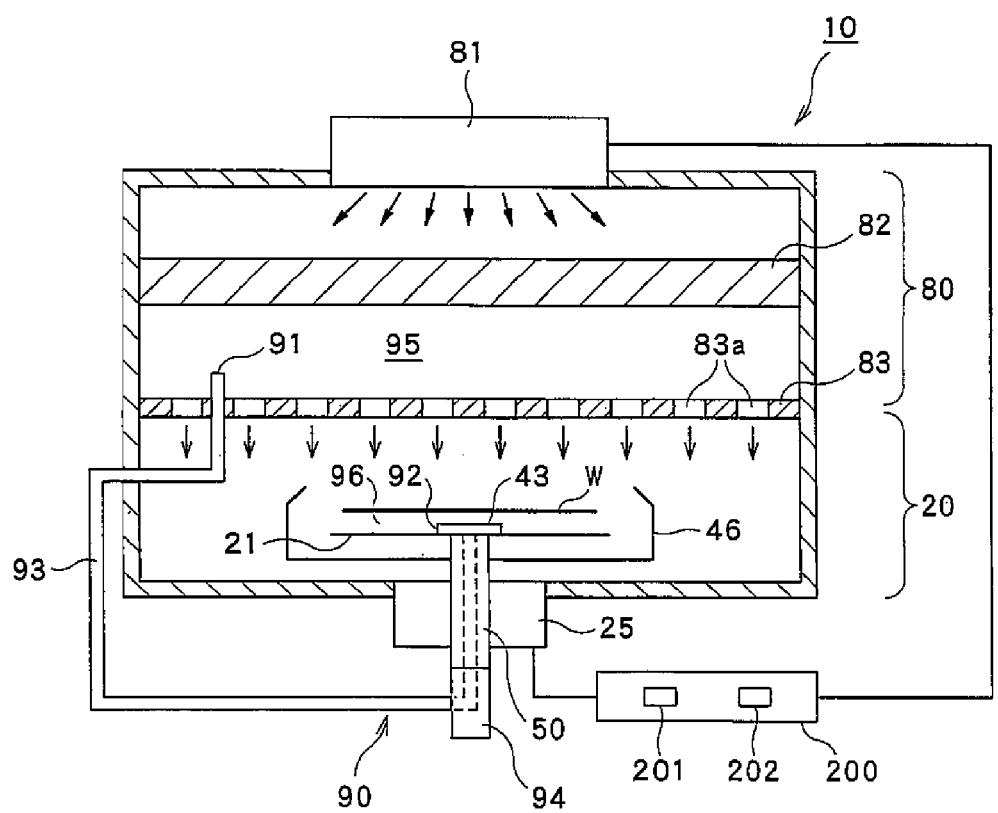
FIG. 2 is a cross-sectional side view illustrating the liquid processing apparatus in the liquid processing system in FIG. 1.

As illustrated in FIG. 2, liquid processing apparatus 10 according to the present exemplary embodiment includes: liquid processing chamber 20 in which wafer W is accommodated and the liquid processing of the accommodated wafer W is performed; and an air hood provided above liquid processing chamber 20 and configured to supply a clean air into liquid processing chamber 20 as a downflow.

A substrate holding unit 21 that holds and rotates wafer W horizontally is provided within liquid processing chamber 20.

A ring type drain cup 46 (described below) is provided to surround the circumference of wafer W held by substrate holding unit 21. Drain cup 46 is provided to recover and drain the processing liquid supplied to wafer W when the liquid processing is performed.

Next, each component of liquid processing apparatus 10 will be described with reference to FIGS. 3 to 9 in detail.

Figure 3:
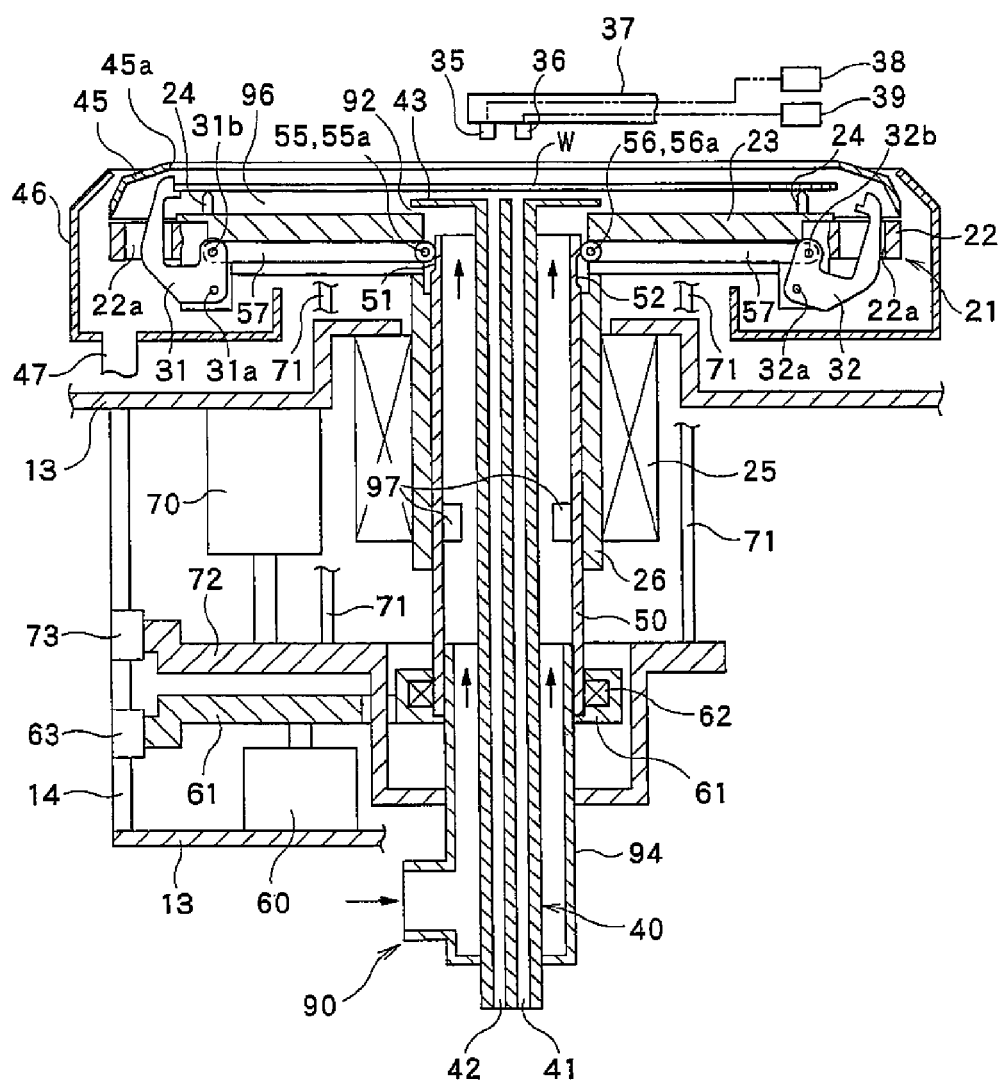
FIG. 3 is a vertical cross-sectional view illustrating a substrate holding unit and components disposed at the surroundings of the substrate holding unit in the liquid processing apparatus illustrated in FIG. 2 in a state where an elevating tube member is located at a descent position.

As illustrated in FIG. 3, substrate holding unit 21 includes: a chuck base (holding base) 22 configured to hold wafer W to be spaced apart from chuck base 22 horizontally; a lift base 23 provided on chuck base 22 to be capable of ascending/descending; a plurality of lift pins 24 provided on lift base 23 and configured to support the bottom surface of wafer W; and six chuck members (engagement members) 31, 32 pivotably provided on chuck base 22.

Figure 5:
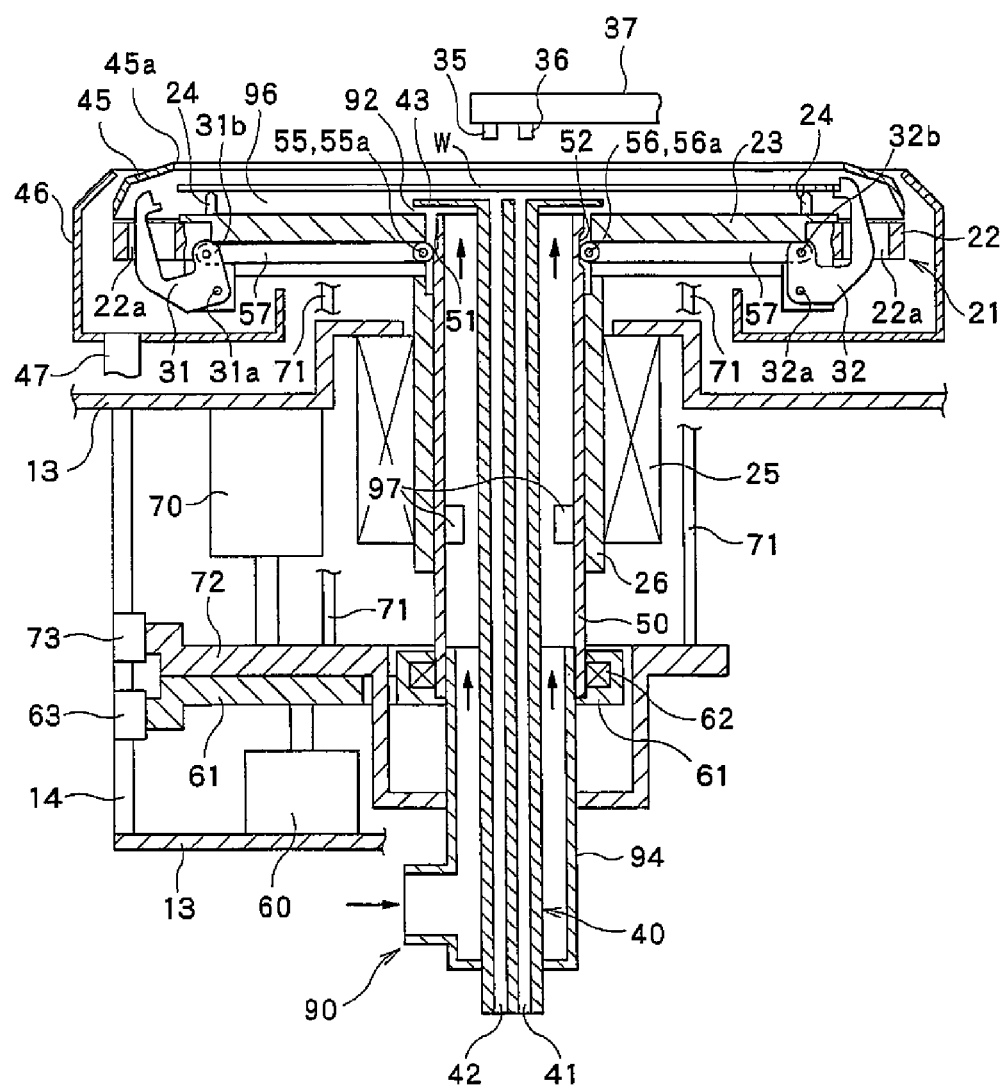
FIG. 5 is a vertical cross-sectional view illustrating the substrate holding unit and the components disposed at the surroundings of the substrate holding unit in the liquid processing apparatus illustrated in FIG. 2 in a state where the elevating tube member is located at a middle position.

Lift base 23 is pushed up by lift rods 71 (described below) and detached from chuck base 22 to be raised. That is, lift base 23 descends/ascends between a descent position disposed on chuck base 22 and an ascent position above the descent position. In particular, when lift base 23 is located at the descent position, a rotation cup 45 (described below) is disposed to surround the circumference of wafer W (see, e.g., FIGS. 3 and 5). In addition, as illustrated in FIG. 5, when lift base 23 is located at the ascent position, wafer W is located above rotation cup 45 and carried in/out by transport arm 104 (see, e.g., FIG. 1). Further, although three lift pins 24 are provided in the circumferential direction with an equal interval, only two lift pins 24 are depicted in FIG. 3 for the convenience.

Figure 4:
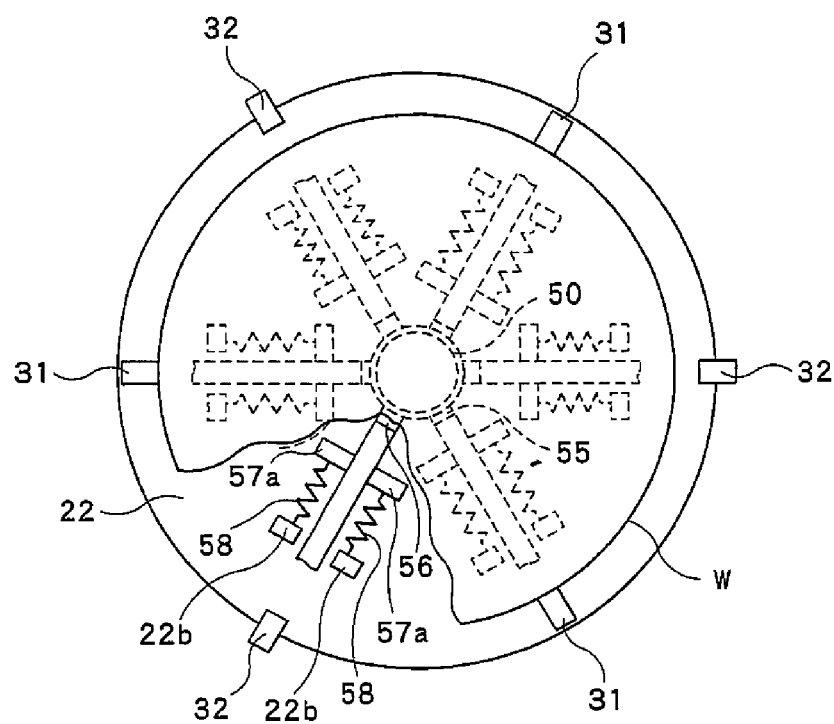
FIG. 4 is a plan view illustrating the substrate holding unit on which a wafer is held.

Six chuck members 31, 32 include three first chuck members 31 and three second chuck members 32 which are alternately disposed in the circumference direction of wafer W, as illustrated in FIG. 4. Wafer W is stably held by these three first chuck members 31 or three second chuck members 32. In addition, although first chuck members 31 and second chuck members 32 may be disposed with equal interval in the circumference direction of wafer W, but the present disclosure is not limited thereto as long as wafer W is capable of being stably held.

Each of chuck members 31, 32 is pivoted (moved) between an engaging position where the member engages with the peripheral edge of wafer W and a releasing position where wafer W is released. That is, each of chuck members 31, 32 is attached to chuck base 22 to be pivoted around corresponding one of pivot positions 31a, 32a, and at the engaging position, the chuck member is contacted with the side surface of wafer W and contacted with the peripheral edge of the bottom surface of wafer W, thereby being engaged with the wafer W. Here, in FIG. 3, first chuck member 31 in the left side is illustrated in a state where the chuck member is located at the engaging position, and second chuck member 32 in the right side is illustrated in a state where the member is located at the releasing position. In addition, each of chuck members 31, 32 is formed to extend to the top side thereof through corresponding one of peripheral penetrating holes 22a formed in the peripheral portion of chuck base 22. Further, while being held by coupling chuck members 31, 32 on the peripheral edge of wafer W, wafer W is slightly spaced apart from lift pins 24.

Such substrate holding unit 21 is configured to be rotated together with wafer W. That is, liquid processing apparatus 10 includes: a frame 13 fixed to liquid processing chamber 20; and a rotation driving unit 25 (for example, rotation motor) attached to frame 13 and configured to rotate substrate holding unit 21. Rotation driving unit 25 includes a cylindrical rotating shaft 26 that is connected to chuck base 22. Accordingly, chuck base 22 is rotated by rotation driving unit 25. Further, when lift base 23 is located at the descent position disposed on chuck base 22, lift base 23 is rotated together with chuck base 22 by being engaged with chuck base 22 in the rotation direction. As such, wafer W held on substrate holding unit 21 is adapted to be rotated horizontally.

As illustrated in FIG. 3, a top side processing liquid nozzle 35 that supplies a processing liquid to the top surface of wafer W is provided above wafer W held by substrate holding unit 21. Top side processing liquid nozzle 35 is supported by a nozzle support arm 37. Further, top side processing liquid nozzle 35 is connected to a processing liquid supply unit 38. Processing liquid supply unit 38 is configured to selectively supply an acidic processing liquid (e.g., diluted hydrofluoric acid (DHF)), an alkaline processing liquid (e.g., SC1 solution made by mixing, for example, ammonium hydroxide and hydrogen peroxide) and a rinse liquid (e.g., deionized water) to top side processing liquid nozzle 35.

Nozzle support arm 37 is provided with a top side dry gas nozzle 36 adjacent to top side processing liquid nozzle 35. Top side dry gas nozzle 36 is connected to a dry gas supply unit 39. Dry gas supply unit 39 is configured to supply a dry gas (e.g., inert gas such as $N_2$ gas) to top side dry gas nozzle 36.

In addition, an elevating shaft member 40 that selectively supplies a processing liquid or a dry gas to the bottom surface of wafer W is provided below wafer W held by chuck base 22. That is, elevating shaft member 40 includes a bottom side processing liquid supply pipe 41 that supplies a processing liquid to the bottom surface of wafer W held by substrate holding unit 21 and a bottom side dry gas supply pipe 42 that supplies a dry gas to the bottom surface of wafer W. In particular, bottom side processing liquid supply pipe 41 is connected to processing supply unit 38 as described above, and acidic processing liquid, alkaline processing liquid and rinse liquid are selectively supplied in synchronization with top side processing liquid nozzle 35. Bottom side dry gas supply pipe 42 is dry gas supply unit 39 as described above, and dry gas is supplied in synchronization with top side dry gas nozzle 36.

Elevating shaft member 40 extends to a position adjacent to the bottom surface of wafer W through a through hole formed at the center of lift base 23 and a through hole formed at the center of chuck base 22. As described above, the processing liquid or the dry gas is supplied to the bottom surface of wafer W from bottom side processing liquid supply pipe 41 and bottom side dry gas supply pipe 42. Further, elevating shaft member 40 is configured to ascend/descend by interlocking with lift base 23, as described below. That is, when lift base 23 is pushed up by lift rods 71 to be described below, elevating shaft member 40 also ascends.

A head member 43 is provided at the upper end of elevating shaft member 40. Head member 43 changes the air flowing direction from an elevating tube member 50 as an air supply path 90 to be described below to the diametric direction of wafer W so that the air is supplied to a space 96 formed between the bottom surface of wafer W and lift base 23. A supply port 92 of air supply path 90 to be described below is formed by head member 43 and lift base 23.

A ring type rotation cup 45 is provided diametrically around wafer W held by substrate holding unit 21. Rotation cup 45 is rotated integrally with chuck base 22 by a connection part (not illustrated). Rotation cup 45 surrounds wafer W held by substrate holding unit 21 around the wafer. For that reason, drain cup 45 may receive the processing liquid scattered laterally from wafer W when the liquid processing of wafer W is performed. Further, rotation cup 45 includes a rotation cup opening 45a which is opened upwardly, and wafer W ascends/descends together with lift base 23 through rotation cup opening 45a when wafer W is carried in/out.

Further, a ring type drain cup (recovery cup) 46 is provided to surround rotation cup 45. Drain cup 46 also surrounds the circumference of substrate holding unit 21 (more specifically, the circumference of rotation cup 45), thereby receiving the processing liquid scattered laterally from wafer W circumference. That is, the processing liquid scattered laterally from a gap between rotation cup 45 and chuck base 22 is recovered by drain cup 46. Further, drain cup 46 is positionally fixed within liquid processing chamber 20 not to be rotated.

A discharging unit 47 that discharges the atmospheric gas within liquid processing chamber 20 is provided below drain cup 46. Specifically, the processing liquid recovered by drain cup 46 is discharged together with the atmospheric gas within liquid processing chamber 20. Discharging unit 47 is connected to a gas/liquid separation unit (not illustrated), and thus, the processing liquid and the gas discharged from discharging unit 47 are separated to be drained and exhausted.

Next, a pivot mechanism that pivots each of chuck members 31, 32 between the engaging position and the releasing position will be described.

Figure 6:
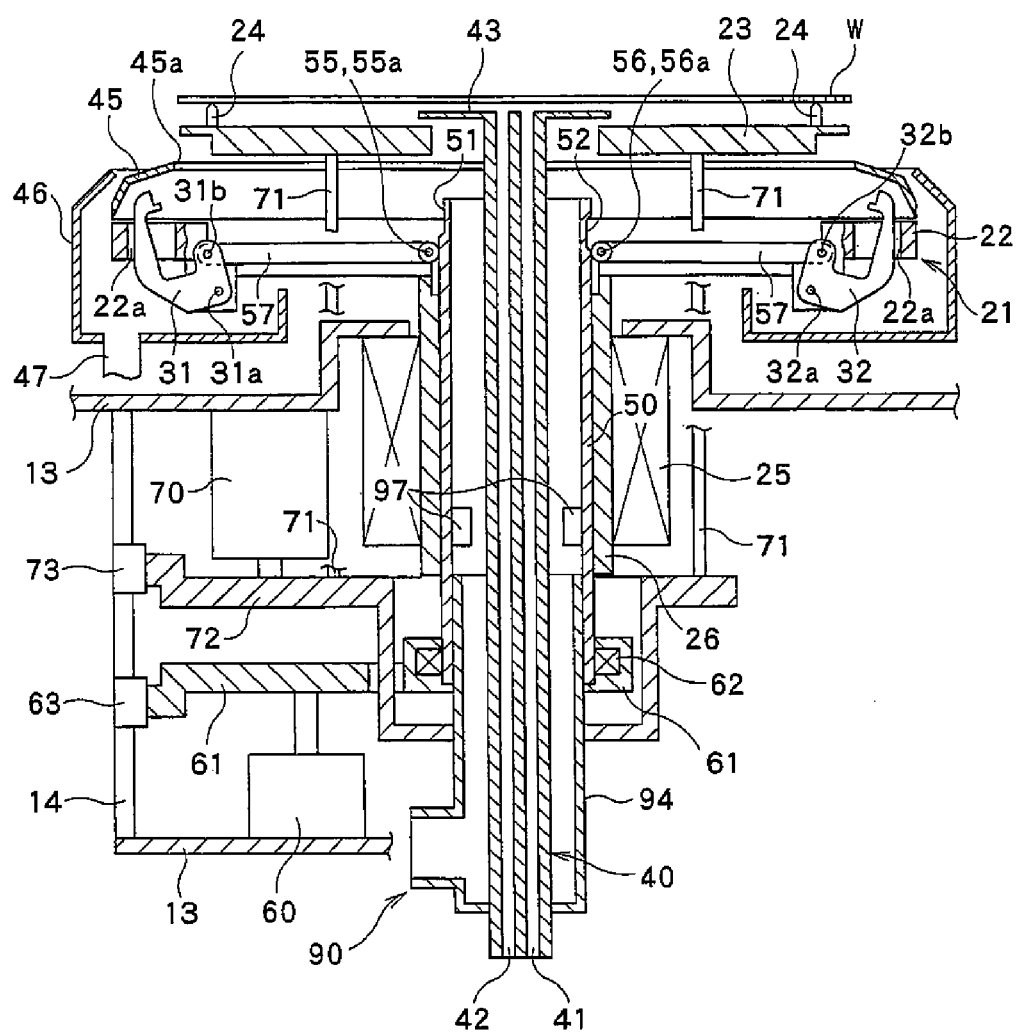
FIG. 6 is a vertical cross-sectional view illustrating the substrate holding unit and the components disposed at the surroundings of the substrate holding unit in the liquid processing apparatus illustrated in FIG. 2 in a state where the elevating tube member is located at a ascent position.

Elevating tube member 50 may be located at a descent position, a middle position disposed above the descent position, or an ascent position disposed above the middle position. Here, FIG. 3 illustrates a state where elevating tube member 50 is located at the descent position, FIG. 5 illustrates a state where elevating tube member 50 is located at the middle position, and FIG. 6 illustrates a state where elevating tube member 50 is located at the ascent position. Further, FIG. 7 illustrates arrangement relationships of elevating tube member 50, a first roller 55a (described below), and a second roller 56a (described below) when elevating tube member 50 is located at each position.

That is, elevating tube member 50 ascends/descends between the descent position where first chuck member 31 is pivoted to the engaging position and the middle position where second chuck member 32 is pivoted to the releasing position. Further, elevating tube member 50 is capable of ascending/descending between the middle position and the ascent position, and, when elevating tube member 50 is located at the ascent position (see, e.g., FIG. 6), first chuck member 31 and second chuck member 32 are located together at the releasing position.

Figure 7:
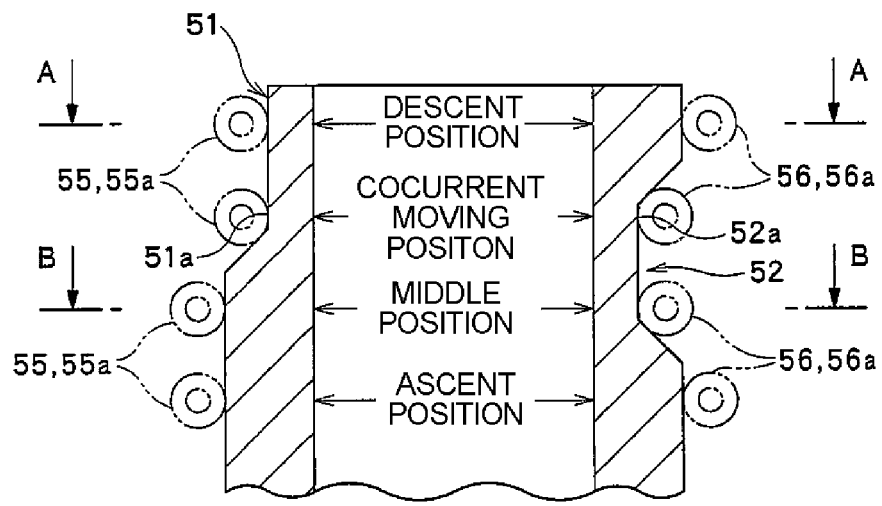
FIG. 7 is a partially enlarged cross-sectional view illustrating the elevating tube member.
Figure 7:
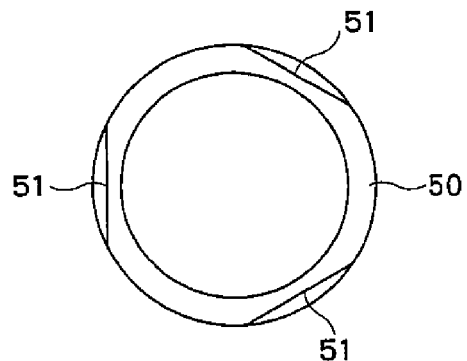
Figure 8B:
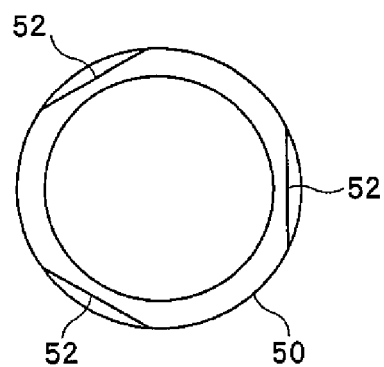
FIG. 8B is a cross-sectional view taken along line B-B in FIG. 7.

As illustrated in FIGS. 3 and 7, elevating tube member 50 includes first portions to be contacted 51 and second portions to be contacted 52 which are provided on the outer peripheral surface of elevating tube member 50 and disposed at different positions with each other in the ascending/descending direction of elevating tube member 50. Schematically, first portions to be contacted 51 are disposed above second portions to be contacted 52, and second portions to be contacted 52 are disposed below first portions to be contacted 51. Further, first portions to be contacted 51 and second portions to be contacted 52 are formed in a concave shape with respect to the outer peripheral surface of elevating tube member 50. In the present exemplary embodiment, concave-shaped first portions to be contacted 51 extend to the upper end of elevating tube member 50, and are illustrated in a step shape in FIG. 3. Further, first portions to be contacted 51 and second portions to be contacted 52 include an inclined surface that is widened toward the outer peripheral surface of elevating tube member 50 from the bottom portion of the concave-shaped recess in the ascending/descending direction. First rollers 55a and second rollers 56a move along the inclined surface. Hereinafter, a case where each of contact portions 55, 56 is moved and contacted with each of portions to be contacted 51, 52 means that each of contact portions 55, 56 contacts with the bottom portion of the concaved recess. Further, three first portions to be contacted 51 and three second portions to be contacted 52 are provided at equal intervals in the circumference direction and spaced apart from each other at an angle corresponding to first chuck members 31 and second chuck members 32, as illustrated in FIGS. 8A and 8B.

As illustrated in FIG. 3, each of first chuck members 31 is connected to a first contact unit 55 that contacts with the outer peripheral surface of elevating tube member 50. When first contact unit 55 contacts with first portion to be contacted 51, first chuck member 31 pivots to the engaging position, and second chuck member 32 pivots to the releasing position. Specifically, one end of a link member 57 is coupled to first chuck member 31 with a link pin 31b. Link pin 31b is disposed above a pivot point 31a of first chuck member 31. First contact unit 55 described above is connected to the other end of link member 57. Further, link member 57 is biased against elevating tube member 50 by a biasing force of spring member 58 (see, e.g., FIG. 4) as described below in detail. First contact unit 55 includes a first cylindrical roller 55a which is capable of being rotated in the ascending/descending direction in the outer peripheral surface of elevating tube member 50. With these configurations, when first contact unit 55 that contacts with the outer peripheral surface of elevating tube member 50 is moved to and contacted with concave-shaped first portion to be contacted 51 by the elevation of elevating tube member 50, link member 57 and link pin 31b are moved toward elevating tube member 50. Therefore, first chuck member 31 pivots around pivot point 31a (in the clockwise direction in FIG. 3) to be located at the engaging position.

In similar, each of second chuck members 32 is connected to a second contact unit 56 that contacts with the outer peripheral surface of elevating tube member 50. When second contact unit 56 contacts with second portion to be contacted 52, first chuck member 31 pivots into the releasing position, and second chuck member 32 pivots to the engaging position. Specifically, one end of a link member 57 is coupled to second chuck member 32 with a link pin 32b. Link pin 32b is disposed above a pivot point 32a of second chuck member 32. Second contact unit 56 described above is connected to other end of link member 57. Further, link member 57 is biased against elevating tube member 50 by a biasing force of spring member 58 (see, e.g., FIG. 4) as described below in detail. Second contact unit 56 includes a second cylindrical roller 56a which is capable of being rotated in the ascending/descending direction in the outer peripheral surface of elevating tube member 50. With these configurations, when second contact unit 56 that contacts with the outer peripheral surface of elevating tube member 50 is moved to and contacted with concave-shaped second portion to be contacted 52 by the elevation of elevating tube member 50, link member 57 and link pin 32b are moved toward elevating tube member 50. Therefore, second chuck member 32 pivots around pivot point 32a (in the counterclockwise direction in FIG. 3) to be located at the engaging position (see, e.g., FIG. 5).

As illustrated in FIG. 4, first roller 55a and second roller 56a are biased against elevating tube member 50 by spring member (biasing force giving mechanism) 58 that serves as a compress spring. That is, one end of spring member 58 is connected to a link side end 57a fixed to link member 57, and the other end thereof is connected to a base side end 22b fixed to chuck base 22. As described above, spring member 58 biases rollers 55a, 56a against elevating tube member 50 via link members 57. As a result, each of chuck members 31, 32 is biased against the engaging position to hold wafer W.

As illustrated in FIG. 4, in the present exemplary embodiment, each of link members 57 is connected to a pair of spring members 58, and is interposed between the pair of spring members 58. As such, the movement of first contact unit 55, second contact unit 56 and link member 57 is facilitated and thus, the pivoting of first chuck member 31 and second chuck member 32 are facilitated as well.

When elevating tube member 50 is located at the descent position by the biasing force of spring member 58, first roller 55a is moved to first portion to be contacted 51. Therefore, three first chuck members 31 are located at their engaging positions, respectively, to hold wafer W, as illustrated in FIGS. 3 and 7. In that case, second roller 56a is seated on the outer peripheral surface of elevating tube member 50, and second chuck member 32 is located at the releasing position.

When elevating tube member 50 is located at the middle position, second roller 56a is moved to second portion to be contacted 52 by the biasing force of spring member 58. Therefore, three first chuck members 32 are located at their engaging positions, respectively, to hold wafer W, as illustrated in FIGS. 5 and 7. In that case, first roller 55a is seated on the outer peripheral surface of elevating tube member 50, and first chuck member 31 is located at the releasing position.

When elevating tube member 50 is located at the ascent position, first roller 55a and second roller 56a are seated together on the outer peripheral surface of elevating tube member 50 and first chuck member 31 and second chuck member 32 are located together at the releasing position, respectively, as illustrated in FIGS. 6 and 7.

However, as illustrated in FIG. 7, a lower portion 51a of first portion to be contacted 51 of elevating tube member 50 is disposed at the same position (height) as in an upper portion 52a of second portion to be contacted 52 in the ascending/descending direction of elevating tube member 50. As a result, an area may be formed in which first portion to be contacted 51 and second portion to be contacted 52 are overlapped in the ascending/descending direction of elevating tube member 50. For that reason, when chuck members 31, 32 to be engaged with wafer W are changed from each other (that is, when elevating tube member 50 ascends from the descent position to the middle position or descends from the middle position to the descent position), first roller 55a and second roller 56a are moved to the corresponding first portion to be contacted 51 and second portion to be contacted 52 at the same time (concurrently advancing position in FIG. 7), and wafer W is temporarily held by first chuck member 31 and second chuck member 32. For that reason, when chuck members 31, 32 to be engaged with wafer W are changed from each other, wafer W may be suppressed from being disposed on lift pins 24 and avoid the state where wafer W is not held by either of first chuck member 31 and second chuck member 32. Therefore, the change of chuck members 31, 32 may be smoothly performed. In addition, lower portion 51a of first portion to be contacted 51 may be disposed below upper portion 52a of second portion to be contacted 52 to increase the area where first portion to be contacted 51 and second portion to be contacted 52 are overlapped in the ascending/descending direction of elevating tube member 50.

Elevating tube member 50 is configured to ascend/descend by an elevating cylinder (elevation driving unit) 60. That is, elevating tube member 50 is connected to elevating cylinder 60 fixed to frame 13 through elevation connecting member 61, and ascends/descends via elevation connecting member 61, as illustrated in FIG. 3. In addition, elevating shaft member 40 extends through the inner side of cylindrical elevating tube member 50, and elevating tube member 50 is also configured to be capable of ascending/descending with respect to elevating shaft member 40.

Figure 9:
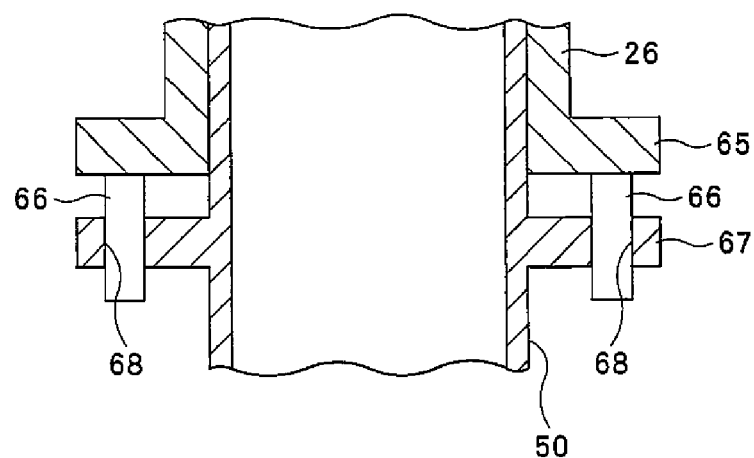
FIG. 9 is a view illustrating a connection part of a rotating shaft of a rotation driving unit and the elevating tube member in detail.

Elevating tube member 50 is connected to rotating shaft 26 of rotation driving unit 25. Specifically, as illustrated in FIG. 9, a rotating shaft flange 65 is fixed to the lower end of rotating shaft 26, and a plurality of insertion pins 66 extend from rotating shaft flange 65 downwardly. An elevating tube flange 67 is fixed to elevating tube member 50, and elevating tube flange 67 is provided with a plurality of insertion holes 68 in which the insertion pins 66 are slidably fit, respectively. Elevating tube member 50 is rotated together with rotating shaft 26 by fitting each of insertion pins 66 with a corresponding insertion hole 68 of elevating tube flange 67, and elevating tube member 50 ascends/descends with respect to rotating shaft 26 as each of insertion pins 66 slides within corresponding insertion hole 68. In this manner, elevating tube member 50 is rotated together with substrate holding unit 21 via rotating shaft 26, and connected to rotating shaft 26 to be capable of ascending/descending. As elevation connecting member 61 is connected to elevating tube member 50 using a bearing 62, elevation connecting member 61 does not rotate together with elevating tube member 50. Therefore, elevating tube member 50 is configured to be freely rotatable with respect to elevation connecting member 61.

Elevation connecting member 61 is provided with an elevating guide member 63. Elevating guide member 52 is guided on a guide rail 14 fixed to frame 13 and ascends/descends along guide rail 14. As a result, elevating tube member 50 may smoothly ascend/descend in the vertical direction.

In the present exemplary embodiment, when elevating tube member 50 is located at the middle position, the top surface of elevating connecting member 61 contacts with the bottom surface of a lift connecting member 72 (described below), as illustrated in FIG. 5. In this case, the ascending force of elevating cylinder 60 is suppressed by a lift cylinder 70 (described below), and thus, elevating tube member 50 connected with elevating connecting member 61 is suppressed from being raised more than needs.

Next, a mechanism that pushes up lift base 23 will be described.

Lift base 23 is configured to ascend/descend by a lift cylinder (lift driving unit) 70 fixed to frame 13. That is, lift rod 71 is pushed up by lift cylinder 70, and thus, lift base 23 is detached from chuck base 22 to be raised. Lift rod 71 is connected to lift cylinder 70 through a lift connecting member 72. More specifically, the lower end of lift rod 71 is fixed to lift connecting member 72, and the upper end of lift rod 71 is capable of being contacted with the bottom surface of lift base 23. That is, when lift base 23 is located at the descent position, the upper end of lift rod 71 is spaced apart from the bottom surface of lift base 23, but the upper end is contacted with the bottom surface of lift base 23 when lift base 23 is raised from chuck base 22. Lift rod 71 extends upwardly through a through hole provided in chuck base 22. As such, lift cylinder 70 raises lift base 23 from chuck base 22 via lift rod 71.

Lift connecting member 72 is connected to an elevating supply pipe 94 of air supply path 90 (described below), and elevating shaft member 40 is fixed to elevating supply pipe 94. As such, lift cylinder 70 raises elevating shaft member 40 together with head member 43 provided at the upper end thereof via lift connecting member 72 and elevating supply pipe 94 when lift base 23 is raised. Elevating supply pipe 94 and elevating tube member 50 freely ascend/descend in relation to each other. That is, the outer surface of elevating supply pipe 94 is slidably fitted in the inner surface of elevating tube member 50. As a result, elevating tube member 50 is configured to freely ascend/descend and be freely rotated with respect to elevating supply pipe 94.

Further, lift connecting member 72 is provided with a lift guide member 73. Lift guide member 73 is guided on a guide rail 14 fixed to frame 13 and ascends/descends along guide rail 14. As a result, lift rod 71 and lift base 23 may smoothly ascend/descend in the vertical direction.

Next, referring to FIG. 2, an air hood 80 will be described.

Air hood 80 is provided with a fan (air supply unit) 81 that is disposed above wafer W held by substrate holding unit 21 and sends (supplies) air toward wafer W. Further, within air hood 80, a filter member 82 is provided below fan 81. Filter member 82 removes for example, dusts from air sent from fan 81 to clean the air. As for filter member 82, an ultra low penetration air filter (ULPA filter) may be appropriately used. Further, a refining member 83 is provided below filter member 82 to be spaced apart from filter member 82. Refining member 83 refines the air cleaned by filter member 82 and forms a downflow onto wafer W. As for refining member 83, a punched plate including a plurality of openings 83a may be appropriately used.

Next, air supply path 90 will be described that supplies air to a space 96 formed between the bottom surface of wafer W and lift base 23.

As illustrated in FIG. 2, air supply path 90 is provided that inhales air supplied from fan 81 and supplies the air to space 96 formed between the bottom surface of wafer W held by substrate holding unit 21 and lift base 23. Since the pressure within space 96 is lowered to a negative pressure by centrifugal force while wafer W is being rotated, the air supplied from fan 81 is inhaled by air supply path 90 and is supplied to space 96 due to a difference between the pressure of space 96 and the pressure in a suction port 91 to be described below.

In the present exemplary embodiment, air supply path 90 is configured to inhale the air of air supply space 95 formed between filter member 82 and refining member 83. That is, air supply path 90 includes a suction port 91 which is disposed in air supply space 95 and configured to inhale the air within air supply space 95 and a supply port 92 which is disposed space 96 formed at the bottom side of wafer W and supplies the air inhaled from suction port 91 to space 96. Suction port 91 is disposed in the outer side of drain cup 46 when viewed in a plan view (when wafer W is viewed from the top, in FIG. 2).

In the present exemplary embodiment, as illustrated in FIGS. 2 and 3, air supply path 90 is mainly configured by a chamber side supply pipe 93 having suction port 91 provided at one end thereof, above-described elevating supply pipe 94 connected to chamber side supply pipe 93 to be capable of ascending/descending, cylindrical elevating tube member 50 (supply pipe) extending through the inner side of cylindrical rotating shaft 26, and head member 43 provided at the upper end of elevating shaft member 40. That is, the air inhaled from suction port 91 is sent to supply port 92 through chamber side supply pipe 93, elevating supply pipe 94 and elevating tube member 50. Chamber side supply pipe 93 is so flexible that it may follow the ascending/descending of elevating supply pipe 94.

Chamber side supply pipe 93 is formed to protrude to the outside of liquid processing chamber 20 through the inside of liquid processing chamber 20 from air supply space 95. In addition, a portion within air hood 80 and a portion within liquid processing chamber 20 in chamber side supply pipe 93 are disposed outside drain cup 46 when viewed in a plan view. As describe above, chamber side supply pipe 93 is suppressed from being disposed in an area above drain cup 46, and the downflow of clean air supplied to an area surrounded by drain cup 46 is suppressed from being disrupted.

As described above, elevating shaft member 40 including bottom side processing liquid supply pipe 41, which supplies processing liquid to the bottom surface of wafer W, is provided inside elevating supply pipe 94 and elevating tube member 50. A space formed between the inner surface of elevating supply pipe 94, the inner surface of elevating tube member 50, and the outer surface of elevating shaft member 40 becomes a flow path of the supplied air.

As illustrated in FIG. 3, wings (swirl generating mechanism) 97 that generate a swirl in the air passing through the inside of elevating tube member 50 are provided on the inner surface of elevating tube member 50. Since elevating tube member 50 is rotated together with wafer W, wings 97 are rotated while wafer W is being rotated. As a result, swirl may be generated in the air passing through the inside of elevating tube member 50 and air may be sent forcibly to space 96 formed at the bottom side of wafer W, thereby increasing the flow rate of air supplied to space 96. For that reason, the pressure of space 96 may be suppressed from being excessively lowered. In particular, although the pressure of space 96 tends to be lowered by centrifugal force as the number of revolutions of wafer W increases, but the flow rate of air supplied to space 96 may increase forcibly by intensifying the swirl according to the number of revolutions of wafer W. Therefore, the pressure of space 96 may be further suppressed from being excessively lowered.

Further, supply port 92 of air supply path 90 is formed by head member 43 provided at the upper end of elevating shaft member 40 and lift base 23. Head member 43 changes the flowing direction air sent from elevating tube member 50 to a diametrical direction of wafer W so as to supply air to space 96 formed at the bottom side of wafer W.

As described above, elevating supply pipe 94 is connected to lift connecting member 72 and ascends/descends by lift cylinder 70. Elevating supply pipe 94 freely ascends/descends with respect to elevating tube member 50, as described above. As a result, elevating supply pipe 94 ascends/descends together with lift base 23.

The cross-section of the flow path of suction port 91 of air supply path 90 is configured to be the same as the cross-section of the flow path of supply port 92 (specifically, the minimum cross-section of the flow path in supply port 92). Due to this, the flow rate of air may be suppressed from being lowered by a pressure loss, and the flow of atmospheric gas around suction port 91 may be suppressed from being scattered. In addition, "the same" is not limited to a meaning of the same in a strict sense, but may be used as a meaning that includes a manufacturing error to a certain degree that may be regarded as the same.

As illustrated in FIG. 2, liquid processing apparatus 10 includes a controller (control unit) 200 that performs an overall control of the entire operations thereof. Controller 200 controls the operations of all the functional components (for example, substrate holding unit 21, rotation driving unit 25, elevating cylinder 60, lift cylinder 70 and fan 81). Controller 200 may be implemented using, for example, a general purpose computer as a hardware and a program (for example, an apparatus control program and a processing recipe) to operate the computer as a software. The software may be stored in a storage medium such as, for example, a hard disc drive which is fixedly provided in the computer, or in a storage medium such as, for example, a CD-ROM, a DVD, and a flash memory which are removably set in the computer. Such a storage medium is indicated by reference numeral 201 in FIG. 2. A processor 202 calls and executes a predetermined processing recipe from storage medium 201 based on, for example, commands from a user interface (not illustrated) as needed, and as a result, each functional component of liquid processing apparatus 10 operates to perform a predetermined processing under the control of controller 200. Controller 200 may be a system controller that controls the entirety of liquid processing system 100 as illustrated in FIG. 1.

Next, a cleaning method of wafer W using above-described liquid processing apparatus 10 will be described with reference to FIG. 10. A series of cleaning processes described below are performed by controlling each of the functional components of liquid processing apparatus 10 by controller 200.

First, wafer W is held on substrate holding unit 21 within liquid processing chamber 20 (step S1).

In this case, lift base 23 is raised to the ascent position first through lift rod 71 by lift cylinder 70. As a result, lift base 23 is located at a position higher than rotation cup 45 and drain cup 46. In this case, lift base 23 is raised together with elevating supply pipe 94 and elevating shaft member 40, and elevating tube member 50 is raised to the ascent position. In addition, shutter 12 is opened which is provided in opening 11 of liquid processing chamber 20 (see, e.g., FIG. 1).

Next, wafer W is carried into liquid processing chamber 20 through opening 11 by transport arm 104 from the outside of liquid processing apparatus 10. Wafer W carried into liquid processing chamber 20 is moved to and mounted on lift pins 24 on lift base 23. After wafer W is disposed on lift pins 24, transport arm 104 retreats from liquid processing chamber 20.

Next, air supply is initiated from fan 81 (step S2). As a result, cleaned air is supplied into liquid processing chamber 20 from air hood 80 as a downflow. That is, the air sent from fan 81 is cleaned by filter member 82 and supplied toward wafer W by refining member 83 as the downflow. The supplied air is discharged from discharging unit 47, and thus, the substitution of the atmosphere gas within liquid processing chamber 20 is performed. In addition, in each process indicated as below, the cleaned air is continuously supplied as well from air hood 80, and thus, mists of acidic processing liquid or mists of alkaline processing liquid are suppressed from being stayed within liquid processing chamber 20.

Next, lift base 23 is lowered to the descent position by lift cylinder 70. As a result, lift base 23 is disposed on chuck base 22. Then, lift cylinder 70 is continuously driven, and lift rod 71 and lift connecting member 72 further descend. As a result, the upper end of lift rod 71 is spaced apart from the bottom surface of lift base 23.

When lift base 23 is lowered, elevating tube member 50 is lowered to the middle position. That is, while lift base 23 is being lowered, the bottom surface of lift connecting member 72 contacts with the top surface of elevating connecting member 61, and elevating connecting member 61 is lowered together with lift connecting member 72 by lift cylinder 70. As a result, elevating tube member 50 is lowered from the ascent position to the middle position. At this time, second roller 56*a* connected to second chuck member 32 is moved to and contacted with concaved second portion to be contacted 52 of elevating tube member 50 by the biasing force of spring member 58. As a result, second chuck members 32 pivot from the releasing position to the engaging position to be engaged with the peripheral edge of wafer W, respectively, and wafer W is transferred to second chuck member 32 from lift pins 24.

After wafer W is held by chuck member 31 of substrate holding unit 21, the rotation of chuck base 22 of substrate holding unit 21 is initiated by rotation driving unit 25, and is accelerated until the rotating speed of wafer W becomes a predetermined rotating speed. As described above, wafer W held by three second chuck members 32 is rotated at the predetermined rotating speed. At this time, chuck base 22 is rotated by rotation driving unit 25 and via rotating shaft 26, and lift base 23 disposed on chuck base 22 is also rotated, and elevating tube member 50 connected to rotating shaft 26 is also rotated synchronously.

When substrate holding unit 21 that holds wafer W is rotated, air is discharged diametrically from space 96 formed between the bottom surface of wafer W and lift base 23 to the circumference thereof by centrifugal force, and the pressure at space 96 is lowered. For this reason, a clean air is inhaled to suction port 91 of air supply path 90 by a required amount from air supply space 95 formed between filter member 82 and refining member 83 within air hood 80. The inhaled air flows to supply port 92 through chamber side supply pipe 93, elevating supply pipe 94 and elevating tube member 50, and is supplied from supply port 92 to space 96. As such, the pressure of space 96 is suppressed from being excessively lowered. Specifically, according to the present exemplary embodiment, since wings 97 are provided on the inner surface of elevating tube member 50, the flow rate of the air supplied to space 96 may be increased forcibly according to the number of revolutions of wafer W, thereby further suppressing the pressure at space 96 from being excessively lowered. In addition, the pressure of space 96 may not be excessively lowered, and the pressure may become a slight negative pressure to such an extent that wafer W is not flexed or damaged. As a result, wafer W may be pulled to space 96 side while being rotated, thereby holding wafer W stably by chuck members 31, 32. Also in each process as described below, while wafer W is being rotated, the cleaned air is continuously supplied to space 96 by air supply path 90.

After the rotating speed of wafer W reaches a predetermined rotating speed, an acidic processing of wafer W (for the convenience, a liquid processing using an acidic processing liquid will be referred to as an "acidic processing") is performed (step S2). That is, in a state where wafer W is rotated at a predetermined rotating speed, an acidic processing liquid is sent to top side processing liquid nozzle 35 and a bottom side processing liquid supply pipe 41 from processing liquid supply unit 38, and thus, acidic processing liquid is supplied to the top surface of wafer W from top side processing liquid nozzle 35 and is supplied to the bottom surface of wafer W from bottom side processing liquid supply pipe 41. Therefore, wafer W is subjected to an acidic processing. The acidic processing liquid supplied to the top surface and the bottom surface of wafer W, is scattered diametrically to the circumference of wafer W by the centrifugal force caused by the rotation of wafer W, and is received in rotation cup 45. The acidic processing liquid received by rotation cup 45 flows diametrically to the circumference through a gap between rotation cup 45 and chuck base 22. Then, the liquid is recovered by drain cup 46. The recovered acidic processing liquid is sent to discharging unit 47 and discharged together with the atmosphere gas within liquid processing chamber 20.

While the acidic processing for wafer W is being performed, chuck members 31, 32 to hold wafer W are changed to each other. That is, the acidic processing is performed in a predetermined time period in a state where wafer W is held by second chuck members 32, and then, chuck members 31, 32 to hold wafer W are changed into first chuck members 31 and then, the acidic processing is performed in a predetermined time period.

In that case, elevating tube member 50 is lowered from the middle position to the descent position by elevating cylinder 60. At this time, first roller 55*a* connected to first chuck member 31 is moved to and contacted with first portion to be contacted 51 of elevating tube member 50 by the biasing force of spring member 58. As a result, each of first chuck members 31 pivots from the releasing position to the engaging position to be engaged with the peripheral edge of wafer W. Meanwhile, second roller 56a moved to second portion to be contacted 52 corresponding to second chuck member 32 retreats by being seated on the cylindrical outer peripheral surface of elevating tube member 50, and second chuck members 32 pivot from the engaging position to the releasing position to release the peripheral edge of wafer W, respectively. As a result, chuck members 31, 32 to hold wafer W are changed, wafer W is held by changed three first chuck members 31 horizontally. For that reason, the areas of wafer W which are covered by three second chuck members 32 are exposed, and the acidic processing for the areas and the surroundings is performed. Further, the time period in which the acidic processing is performed in a state where wafer W is held by second chuck members 32 and the time period in which the acidic processing is performed in a state where wafer W is held by first chuck members 31 may become equal. As a result, the acidic processing for wafer W is further uniformized.

However, when chuck members 31, 32 to hold wafer W are changed, wafer W is temporarily held by first chuck members 31 and second chuck members 32. That is, since lower portion 51a of first portion to be contacted 51 of elevating tube member 50 is disposed at the same position (height) as upper portion 52a of second portion to be contacted 52 in the ascending/descending direction, first roller 55a is moved to first portion to be contacted 51 before second roller 56a, which is moved to second portion to be contacted 52, is seated on the outer surface of elevating tube member 50 according to the descending of elevating tube member 50. As a result, first chuck members 31 and second chuck members 32 are temporarily disposed together at the engaging position. Then, elevating tube member 50 is further lowered, second roller 56a is seated on the outer surface of elevating tube member 50 and second chuck members 32 pivot from the engaging position to the releasing position, respectively. As a result, chuck members 31, 32 to hold wafer W are changed.

After the acidic processing of wafer W is terminated, wafer W is rinsed (step S3). In this case, deionized water (DIW) is sent to top side processing liquid nozzle 35 and bottom side processing liquid supply pipe 41 from processing liquid supply unit 38. Therefore, the deionized water is supplied to the top surface of wafer W from top side processing liquid nozzle 35 and to the bottom surface of wafer W from bottom side processing liquid supply pipe 41.

While the rinse processing for wafer W is performed, chuck members 31, 32 to hold wafer W are changed. That is, the rinse processing is performed in a predetermined time period in a state where wafer W is held by first chuck members 31, and then, chuck members 31, 32 to hold wafer W are changed into second chuck members 32 and the rinse processing is performed in a predetermined time period.

In that case, elevating tube member 50 is raised from the descent position to the middle position by elevating cylinder 60. At this time, second roller 56a connected to second chuck member 32 is moved to and contacted with second portion to be contacted 52 of elevating tube member 50 by the biasing force of spring member 58. As a result, second chuck members 32 pivot from the releasing position to the engaging position to be engaged with the peripheral edge of wafer W, respectively. Meanwhile, first roller 55a moved to first portion to be contacted 51 corresponding to first chuck member 31 retreats by being seated on the cylindrical outer peripheral surface of elevating tube member 50, and first chuck members 31 pivot from the engaging position to the releasing position to release the peripheral edge of wafer W, respectively. As described above, wafer W is held horizontally by changed three second chuck members 32. For that reason, chuck members 31, 32 to hold wafer W are changed, areas covered by three first chuck members 31 are exposed, and the rinse processing for the areas and the surroundings is performed. Further, the time period in which the rinse processing is performed in a state where wafer W is held by first chuck members 31 and the time period in which the rinse processing is performed in a state wafer W is held by second chuck members 32 may become equal. As a result, the rinse processing for wafer W is further uniformized.

However, when chuck members 31, 32 to hold wafer W are changed, wafer W is temporarily held by first chuck members 31 and second chuck members 32 as in the case where elevating tube member 50 is lowered from the middle position to the descent position. That is, as elevating tube member 50 is raised, second roller 56a is moved to second portion to be contacted 52 before first roller 55a moved to first portion to be contacted 51 is seated on the outer surface of elevating tube member 50. As a result, first chuck members 31 and second chuck members 32 are temporarily disposed together at the engaging position. Then, elevating tube member 50 is further raised, first roller 55a is seated on the outer surface of elevating tube member 50 and first chuck members 31 is pivoted from the engaging position to the releasing position, respectively. As a result, chuck members 31, 32 to hold wafer W are changed.

After the rinse processing of wafer W is terminated, wafer W is subjected to an alkaline processing (for the convenience, a liquid processing by alkaline processing liquid will be referred as an "alkaline processing") (step S4). At this time, as in the acidic processing from processing liquid supply unit 38, an alkaline processing liquid is supplied to the top surface of wafer W via top side processing liquid nozzle 35 and is supplied to the bottom surface of wafer W via bottom side processing liquid supply pipe 41. The alkaline processing liquid supplied to the top surface and the bottom surface of wafer W is recovered by drain cup 46, and sent to discharging unit 47 to be discharged.

While the alkaline processing for wafer W is performed, as in the above described acidic processing, elevating tube member 50 is lowered from the middle position to the descent position, and chuck members that hold wafer W are changed from second chuck members 32 to first chuck members 31. As a result, areas of wafer W which are covered by three second chuck members 32 are exposed, and the alkaline processing for the areas and the surroundings is performed.

Continuously, wafer W is rinsed as in step S3 (step S5).

After the rinse processing of wafer W is terminated, wafer W is dried (step S6). At this time, a dry gas is supplied to the top surface of wafer W via top side dry gas nozzle 36 and is supplied to the bottom surface of wafer W via bottom side dry gas supply pipe 42 from dry gas supply unit 39. The dry gas supplied to the top surface and the bottom surface of wafer W is recovered by drain cup 46 and sent to discharging unit 47 to be discharged as the acidic processing liquid and alkaline processing liquid.

While the dry processing for wafer W is being performed, as in the above described acidic processing and alkaline processing, elevating tube member 50 is lowered from the middle position to the descent position, and chuck members 31, 32 that hold wafer W are changed from second chuck members 32 to first chuck members 31. As a result, areas of wafer W which are covered by three second chuck members 32 are exposed, and the dry processing for the areas and the surroundings is performed.

After the dry processing of wafer W is terminated, the rotating speed of wafer W is reduced and the rotation of wafer W is stopped. As a result, the negative pressure state of space 96 formed at the bottom side of wafer W is released, and the supply of air to space 96 by air supply path 90 is stopped.

Then, wafer W is taken out from substrate holding unit 21 to be carried out from liquid processing apparatus 20 (step S7).

In that case, elevating tube member 50 is raised first from the descent position to the middle position by elevating cylinder 60. Next, lift base 23 is raised from the descent position thereof to the ascent position and elevating tube member 50 is raised from the middle position thereof to the ascent position by lift cylinder 70 and elevating cylinder 60. As a result, wafer W is released from chuck members 31, 32 and is disposed on lift pins 24. In addition, wafer W is located at a position higher than rotation cup 45 and drain cup 46 according to the ascending of lift base 23. In addition, shutter 12 is opened which is provided in opening 11 of liquid processing chamber 20 (see, e.g., FIG. 1). Then, transport arm 104 enters liquid processing chamber 20 from the outside of liquid processing apparatus 10 through opening 11, wafer W disposed on lift pins 24 is moved to and mounted on transport arm 104, and wafer W is carried out to the outside of liquid processing apparatus 10. As a result, a series of liquid processing of wafer W according to the present exemplary embodiment are completed.

According to the present exemplary embodiments described above, in each process (acidic processing, alkaline processing, rinse processing, and dry processing), chuck members 31, 32 that hold wafer W are changed as elevating tube member 50 ascends/descends. As a result, areas of wafer W are exposed which are in contact with chuck members 31, 32 that hold wafer W before the change, various processings for the areas may be performed. Specifically, although the surroundings are also difficult to be processed while the above-described areas of wafer W are in contact with chuck members 31, 32, the processings for the surroundings are also performed by changing chuck members 31, 32 that hold wafer W as described above. For that reason, unprocessed area where processings are not performed is prevented from being formed, various processings for wafer W may be uniformized.

Further, according to the present exemplary embodiment, the change of chuck members 31, 32 may be formed as elevating tube member 50 ascends/descends. As a result, the change of chuck members 31, 32 may be any timing.

Further, according to the present exemplary embodiment, first portions to be contacted 51 and second portions to be contacted 52 are formed in a concave shape with respect to the outer peripheral surface of elevating tube member 50. As a result, the machining working for elevating tube member 50 may simplicated.

Further, according to the present exemplary embodiment, lower portion 51*a* of first portion to be contacted 51 is disposed at the same position as in upper portion 52*a* of second portion to be contacted 52 in the ascending/descending direction of elevating tube member 50. As a result, when chuck members 31, 32 that engage with wafer W are changed, first roller 55*a* and second roller 56*a* are moved to corresponding first portion to be contacted 51 or second portion to be contacted 52 at the same time, and wafer W may be temporarily held by first chuck members 31 and second chuck members 32. For that reason, when chuck members 31, 32 to be engaged with wafer W are changed from each other, wafer W may be avoided from the state where wafer W is not held by either of first chuck members 31 and second chuck members 32 and be suppressed from being disposed on lift pins 24.

Therefore, the change of chuck members 31, 32 may be smoothly performed. Further, the change of chuck members 31, 32 may be performed without stopping the rotation of wafer W. Therefore, the efficiency of liquid processing for wafer W may be prevented from being lowered.

According to the present exemplary embodiments, first contact unit 55 connected to first chuck member 31 includes first roller 55*a* which is capable of being rotated in the ascending/descending direction of elevating tube member 50. As a result, first contact unit 55 may follow the elevation of elevating tube member 50 smoothly. For that reason, first chuck member 31 may be pivoted smoothly. In the same way, second contact unit 56 connected to second chuck member 32 includes second roller 56*a* which is capable of being rotated in the ascending/descending direction of elevating tube member 50. Therefore, second contact unit 56 may follow the ascending/descending of elevating tube member 50 and second chuck member 32 may be pivoted smoothly. As a result, when chuck members 31, 32 are changed to each other, wafer W may be suppressed from being impacted by chuck members 31, 32 and the peripheral edge of wafer W may be suppressed from being damaged by the pivoting of first chuck members 31 or second chuck members 32.

Further, according to the present exemplary embodiment, elevating tube member 50 is formed in a cylindrical shape. As a result, bottom side processing liquid supply pipe 41 to supply processing liquid to the bottom surface of wafer W may be passed through the inner side of elevating tube member 50. For that reason, the bottom surface of wafer W may be liquid processed, thereby suppressing unprocessed area of wafer W from being formed.

Further, according to the present exemplary embodiment, elevating tube member 50 is rotated together with substrate holding unit 21. As a result, the engaging position or releasing position of first chuck members 31 and second chuck members 32 may be held. That is, first roller 55*a* or second roller 56*a*, which is moved to first portion to be contacted 51 or second portion to be contacted 52 of elevating tube member 50 and is being rotated together with first chuck member 31 and second chuck member 32, may be held in the moved state. For that reason, wafer W may be surely held while wafer is being rotated.

According to the present exemplary embodiment, while wafer W is being rotated, the pressure at space 96 formed between wafer W and lift base 23 may be lowered to a negative pressure by the centrifugal force, and the cleaned air may be inhaled from air supply space 95 by air supply path 90 and be supplied to space 96 formed at the bottom side of wafer W according to the pressure difference between space 96 formed at the bottom side of wafer W and air supply space 95 formed between filter member 82 and refining member 83 within air hood 80. Therefore, the pressure at space 96 formed at the bottom side of wafer W may be suppressed from being excessively lowered, and wafer W may be suppressed from being bent or damaged by the pressure down of space 96 formed at the bottom side of wafer W. That is, although wafer W may be flexed or damaged when the pressure at space 96 formed at the bottom side of wafer W is lowered, since the pressure at space 96 formed at the bottom side of wafer W is suppressed from being excessively lowered according to the present exemplary embodiment, wafer W may be suppressed from being bent or damaged. Further, since the air supplied from fan 81 to liquid processing chamber 20 is used to suppress the excessive lowering of space 96 formed at the bottom side of wafer W, the operational cost for suppression of the flexure and damage of wafer W may be surely decreased as compared to a case where, for example, N₂ gas is used. As a result, the flexure and damage of wafer W may be suppressed with small operational cost.

Further, according to the present exemplary embodiment, suction port 91 of air supply path 90 is located at the outside of drain cup 46, when viewed from the top. As a result, the downflow of the cleaned air supplied to an area surrounded by drain cup 46 within liquid processing chamber 20 may be suppressed from being disrupted. For that reason, the cleaned air may be effectively supplied toward wafer W and the atmospheric gas within liquid processing chamber 20 may be effectively substituted.

Further, according to the present exemplary embodiment, the cross section of suction port 91 of air supply path 90 is the same as that of supply port 92. As a result, the flow rate of air may be suppressed from being lowered by the pressure loss, and the flow of the atmosphere around suction port 91 may be suppressed from being disrupted. For that reason, the cleaned air may be effectively supplied toward wafer W and the atmosphere within liquid processing chamber 20 may be effectively substituted.

Further, according to the present exemplary embodiment, air supply path 90 extends through the inner side of cylindrical rotating shaft 26 of rotation driving unit 25. As a result, in space 96 formed at the bottom side of wafer W, air may be supplied to the substantially central portion where pressure is most lowered, and thus, the pressure of space 96 may be effectively suppressed from being excessively lowered.

Further, according to the present exemplary embodiment, bottom side processing liquid supply pipe 41 configured to supply processing liquid to the bottom surface of wafer W is provided inside elevating supply pipe 94 of air supply path 90. As a result, the bottom surface of wafer W may liquid processed, the pressure of space 96 formed at the bottom side of wafer W may be suppressed from being lowered, thereby preventing the flexures and damages of wafer W.

Further, according to the present exemplary embodiment, bottom side processing liquid supply pipe 41 to supply processing liquid to the bottom surface of wafer W is provided inside elevating tube member 50. As a result, the bottom surface of wafer W may be liquid processed, thereby preventing the flexures and damages of wafer W.

Further, according to the present exemplary embodiment, wings 97 to generate the swirl for the air passing through elevating tube member 50 are provided on the inner surface of elevating tube member 50. As a result, the swirl may be strengthened based on the number of revolutions of wafer W, thereby forcibly increasing the flow rate of the air supplied to space 96 formed at the bottom side of wafer W. For that reason, the pressure at space 96 formed at the bottom side of wafer W may be further suppressed from being excessively lowered.

Further, the liquid processing apparatus according to the present exemplary embodiment is not limited to the above aspects, and various modifications may be made thereto.

For example, in the present exemplary embodiment, an example is described where first portion to be contacted 51 and second portion to be contacted 52 are formed in a concaved shape with respect to the outer peripheral surface of elevating tube member 50, but the present disclosure is not limited thereto, and first portion to be contacted 51 and second portion to be contacted 52 may be formed in a convex shape on the outer peripheral surface of elevating tube member 50. In this case, for example, link pins 31*b*, 32*b* that connect chuck members 31, 32 with link members 57 are disposed below pivot positions 31*a*, 32*a* of chuck members 31, 32, respectively. Therefore, first contact unit 55 (or second contact unit 56) is retreated by corresponding first portion to be contacted 51 (or second portion to be contacted 52), and first chuck member 31 (or second chuck member 32) may be pivoted from the releasing position to the engaging position.

In the present exemplary embodiment, in each processing, an example where chuck members 31, 32 that hold wafer W are changed once is described. Without limiting thereto, chuck members 31, 32 that hold wafer W may be changed in plural times. Further, in the acidic processing, alkaline processing and dry processing, an example is described where wafer W is held by second chuck members 32 first, and then chuck members 31, 32 that hold wafer W are changed from second chuck members 32 to first chuck members 31. However, the present disclosure is not limited thereto, wafer W may be held by first chuck members 31 first, and then first chuck members 31 may be changed to second chuck members 32. In the same way, in rinse processing, the present disclosure is not limited to a case where wafer W is held by first chuck members 31 first, and then chuck members 31, 32 that hold wafer W are changed from first chuck members 31 to second chuck members 32. Wafer W may be held by second chuck members 32 first, and then second chuck members 32 may be changed to first chuck members 31. That is, in each processing, chuck members 31, 32 that hold wafer W may be any one of first chuck members 31 and second chuck members 32 as long as chuck members 31, 32 are changed at least once.

Further, according to the present exemplary embodiment, an example is described where elevating tube member 50 that pivots chuck members 31, 32 is formed in a cylindrical shape. However, the present disclosure is not limited thereto, and when processing liquid or dry gas is not supplied to the bottom surface of wafer W, a solid type elevating member may be used.

Further, in the present exemplary embodiment, an example is described where first contact unit 55 includes first roller 55*a* capable of being rotated in the ascending/descending direction of elevating tube member 50 and second contact unit 56 includes second roller 56*a* capable of being rotated in the ascending/descending direction of elevating tube member 50. However, first contact unit 55 and second contact unit 56 may include a sphere capable of being moved to first portion to be contacted 51 or second portion to be contacted 52, instead of cylindrical rollers 55*a*, 56*a*.

Further, in the present exemplary embodiment, an example is described where first chuck members 31 and second chuck members 32 may be pivoted between the engaging position and the releasing position. However, the present disclosure is not limited thereto. First chuck members 31 and second chuck members 32 may be configured to be moved in a straight line between the engaging position and the releasing position.

Further, although, in the present exemplary embodiment, an example is described where chuck members 31, 32 are biased toward the engaging position by spring members 58 as a biasing force giving mechanism, the present disclosure is not limited thereto, and for example, chuck members 31, 32 may be biased using a compression air or a magnet.

Further, although, in the present exemplary embodiment, an example is described where air supply path 90 is provided, the present disclosure is not limited thereto.

Further, in the present exemplary embodiment, an example is described where a cleaning liquid (for example, acidic processing liquid, and alkaline processing liquid) that cleans wafer W is supplied to wafer W and cleaning (liquid processing) for wafer W is performed. However, the present disclosure is not limited thereto, and the present disclosure may apply to a case where for example, etching liquid, plating liquid, and developing liquid is supplied to wafer W, and thus, wafer W is etched, plated, and developed.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A liquid processing apparatus comprising:
a substrate holding unit configured to hold a substrate horizontally;
a nozzle configured to supply a processing liquid to the substrate held by the substrate holding unit;
an elevating member configured to ascend/descend with respect to the substrate holding unit; and
an elevation driving unit configured to raise/lower the elevating member,
wherein the substrate holding unit includes a holding base, and a first engagement member and a second engagement member which are provided to be movable in the holding base, and each of the first and second engagement members is moved by a biasing force of a biasing force giving mechanism between an engaging position where each of the first and second engagement members is engaged with the peripheral edge of the substrate and a releasing position where each of the first and second engagement members releases the substrate,
the first engagement member is connected with a first contact unit contacted with the outer peripheral surface of the elevating member,
the second engagement member is connected to a second contact unit contacted with the outer peripheral surface of the elevating member,
the elevating member includes a first portion to be contacted and a second portion to be contacted at a lower position than the first portion which are provided in the outer peripheral surface of the elevating member and disposed at different positions in the ascending/descending direction of the elevating member,
when the first contact unit is in contact with the first portion to be contacted, the first engagement member is located at the engaging position and the second engagement member is located at the releasing position, and
when the second contact unit is in contact with the second portion to be contacted, the second engagement member is located at the engaging position and the first engagement member is located at the releasing position.

2. The liquid processing apparatus of claim 1, wherein, when the first contact unit and the second contact unit are in contact with the outer peripheral surface of the elevating member other than the first portion to be contacted and the second portion to be contacted, the first engagement member and the second engagement member are located at the releasing position.

3. The liquid processing apparatus of claim 2, wherein when the first contact unit is in contact with the first portion to be contacted, the second contact unit is in contact with an outer peripheral surface of the elevating member other than the first portion to be contacted and the second portion to be contacted.

4. The liquid processing apparatus of claim 3, wherein a lower portion of the first portion to be contacted is located at the same position or below an upper portion of the second portion to be contacted in the ascending/descending direction of the elevating member.

5. The liquid processing apparatus of claim 4, wherein the first portion to be contacted and the second portion to be contacted are formed in a concave shape with respect to the outer peripheral surface of the elevating member.

6. The liquid processing apparatus of claim 5, wherein each of the first contact unit and the second contact unit includes a roller capable of being rotated in the ascending/descending direction in the outer peripheral surface of the elevating member.

7. The liquid processing apparatus of claim 6, further comprising a rotation driving unit that includes a rotating shaft which rotates the substrate holding unit,
wherein the elevating member is connected to the rotating shaft and rotated together with the substrate holding unit.

8. The liquid processing apparatus of claim 7, wherein the substrate holding unit includes three first engagement members and three second engagement members which are disposed alternately in the circumference direction of the substrate, and
the elevating member includes three first portions to be contacted and three second portions to be contacted which correspond the first engagement members and the second engagement members, respectively.

9. The liquid processing apparatus of claim 2, wherein, while the processing liquid is being supplied from the nozzle,
the first contact unit is moved from the first portion to be contacted to a position where the first contact unit is in contact with an outer peripheral surface of the elevating member other than first portion to be contacted and the second portion to be contacted, and the second contact unit is moved from a position where the second contact unit is in contact with an outer peripheral surface of the elevating member other than the first portion to be contacted and the second portion to be contacted to the second portion to be contacted.

10. The liquid processing apparatus of claim 9, wherein a time period where the first contact unit is in contact with the first portion to be contacted and a time period where the second contact unit is in contact with the second portion to be contacted are overlapped.

11. The liquid processing apparatus of claim 10, wherein a lower portion of the first portion to be contacted is located at the same position or below an upper portion of the second portion to be contacted in the ascending/descending direction of the elevating member.

12. The liquid processing apparatus of claim 11, wherein each of the first contact unit and the second contact unit includes a roller capable of being rotated in the ascending/descending direction in the outer peripheral surface of the elevating member.

13. The liquid processing apparatus of claim 12, further comprising a rotation driving unit that includes a rotating shaft which rotates the substrate holding unit,
wherein the elevating member is connected to the rotating shaft and rotated together with the substrate holding unit.

14. The liquid processing apparatus of claim 13, wherein the substrate holding unit includes three first engagement members and three second engagement members which are disposed alternately in the circumference direction of the substrate, and
the elevating member includes three first portions to be contacted and three second portions to be contacted which correspond the first engagement members and the second engagement members, respectively.

15. The liquid processing apparatus of claim 9, wherein the nozzle is configured to supply a processing liquid to the top surface of the substrate held by the substrate holding unit, the elevating member is formed in a cylindrical shape, and in the inner side of the elevating member, a bottom side processing liquid supply pipe that supplies a processing liquid to the bottom surface of the substrate held by the substrate holding unit is provided.

16. The liquid processing apparatus of claim 15, further comprising a rotation driving unit that includes a rotating shaft which rotates the substrate holding unit,
wherein the elevating member is connected to the rotating shaft and rotated together with the substrate holding unit.

17. The liquid processing apparatus of claim 16, wherein the substrate holding unit includes three first engagement members and three second engagement members which are disposed alternately in the circumference direction of the substrate, and
the elevating member includes three first portions to be contacted and three second portions to be contacted which correspond the first engagement members and the second engagement members, respectively.

18. The liquid processing apparatus of claim 2, wherein a lower portion of the first portion to be contacted is located at the same position or below an upper portion of the second portion to be contacted in the ascending/descending direction of the elevating member.

19. The liquid processing apparatus of claim 18, wherein the first portion to be contacted and the second portion to be contacted are formed in a concave shape with respect to the outer peripheral surface of the elevating member.

* * * * *